United States Patent [19]
Kazuya et al.

[11] Patent Number: 5,929,682
[45] Date of Patent: Jul. 27, 1999

[54] CLOCK SIGNAL GENERATOR, CLOCK SIGNAL GENERATING SYSTEM, AND CLOCK PULSE GENERATION METHOD

[75] Inventors: Ioki Kazuya, Ohmihachiman; Michinori Nishihara, Shiga-ken, both of Japan

[73] Assignee: International Business Machines Corp., Armonk, N.Y.

[21] Appl. No.: 08/805,845

[22] Filed: Mar. 3, 1997

[30] Foreign Application Priority Data

May 9, 1996 [JP] Japan .................................. 8-114704

[51] Int. Cl.⁶ .............................. H03K 5/159; H03L 7/06
[52] U.S. Cl. ......................... 327/291; 327/293; 327/294; 327/147; 327/149; 327/150; 327/158; 327/159
[58] Field of Search ..................................... 327/291, 293, 327/294, 299, 147, 149, 150, 156, 158, 159, 244, 245

[56] References Cited

U.S. PATENT DOCUMENTS

| | | | |
|---|---|---|---|
| 4,789,996 | 12/1988 | Butcher | 375/120 |
| 5,295,164 | 3/1994 | Yamamura | 375/120 |
| 5,428,309 | 6/1995 | Yamauchi et al. | 327/158 |
| 5,477,196 | 12/1995 | Yamauchi et al. | 331/60 |
| 5,491,673 | 2/1996 | Okayasu | 368/120 |

*Primary Examiner*—Timothy P. Callahan
*Assistant Examiner*—An T. Luu
*Attorney, Agent, or Firm*—Daniel E. McConnell

[57] ABSTRACT

The present invention is a clock generator circuit using semiconductor integrated circuits and which has an input logic circuit to which an external clock signal is supplied; a delaying element chain in which a plurality of delay elements connected to the input logic circuit are serially connected together; a plurality of delay element selectors connected to each of the plurality of delay elements, respectively; a loop closing circuit connected to the delay element connected to a specific delay element selector which to a state indicating a selected status and to the input logic circuit, for forming a closed loop between the delay element chain and the input logic circuit; and an external output connected to the input logic circuit.

10 Claims, 3 Drawing Sheets

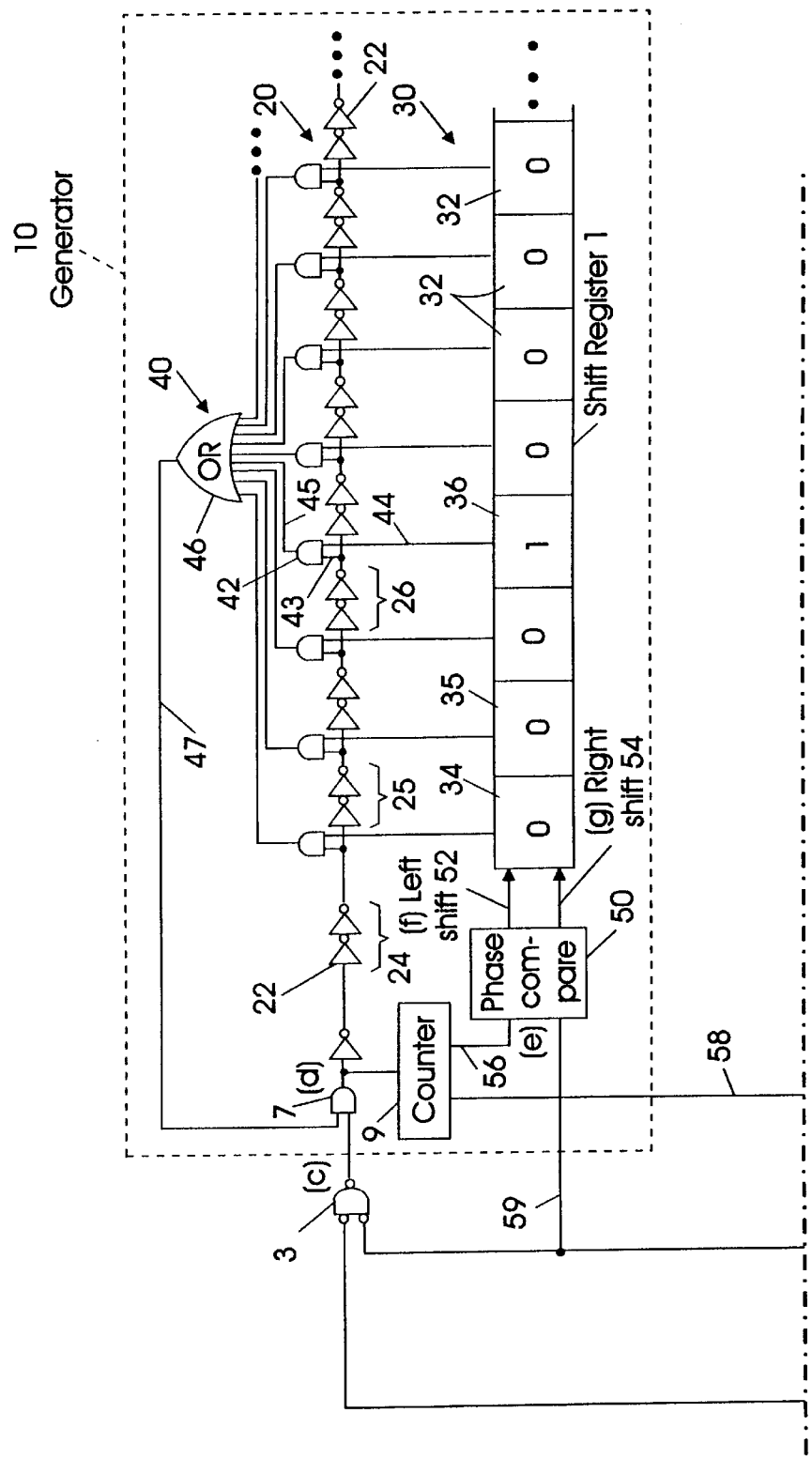

CLOCK SIGNAL GENERATOR, CLOCK SIGNAL GENERATING SYSTEM, AND CLOCK PULSE GENERATION METHOD

BACKGROUND OF THE INVENTION

The present invention is a clock generator circuit using semiconductor integrated circuits.

A clock generator circuit is a circuit which stably generates a clock signal having a frequency higher than an input clock signal.

In recent years, a clock having an extremely high frequency has been required as data processing speed has dramatically increased. Thus, a method is conceived in which a circuit for generating a clock signal having a high frequency is directly mounted on a board. However, since waveform distortions inevitably occur in this method, there is a limit to the frequency, and the upper limit is about 50 MHZ. Further, in personal computers, the types of clocks usable on the board are limited, and the use of clocks other than those requires additional crystal oscillators, but this is a problem in the point of cost. Accordingly, it is needed to previously mount an external clock signal generator circuit of a relatively low frequency on the board, and form a clock generator circuit for performing a conversion to increase the frequency on a chip.

Conventionally, the clock generator circuit consists of a PLL (Phase Lock Loop) which is an analog circuit. The clock generator by the analog PLL has good stability in operation, and has a high precision as a whole in the point that it is finely adjustable, and thus it is widely used. The advantage of the analog clock generator is that it has a high precision as described above. High precision is a large advantage of the clock generator, a circuit which generates a clock signal with a precision of one several tens of thousandth second. However, the analog clock generator has the following disadvantages.

First, it takes much time for the frequency to converge on a stable state. This is because one reason for the high precision of the analog clock generator is based on the fact that it can be finely adjusted. However, the amount of one adjustment needs to be made small to exhibit such merit, and as a result, the convergence time becomes long.

Second, there is also a problem with the design and implementation. That is, a power supply for analog equipment and a GND pin need to be prepared for using the analog clock generator, and registers and capacitors need to be prepared in addition to chips. Moreover, the whole design must be renewed if the technology being used changes, and thus it is not suitable for the process in which products are made by trial and error.

The merit obtainable by the construction of the clock generator using a digital circuit resides in that the above disadvantages of the clock generator by an analog circuit can be eliminated. That is, since digital is essentially binary, attention need not be paid to detail differently from analog. By this, the merit of an analog circuit that fine adjustment can be made may be lost to some extent in the clock generator by a digital circuit, but the merit in the aspect of design and implementation is unmeasurable.

In the conventional digital circuit, however, a signal having a frequency larger than the input clock cannot be generated without using a delay element. Further, the extent of the delay by the delay element varies depending on the conditions such as temperature and voltage. Accordingly, to form a stable clock generator by a digital circuit, a function is required for self-compensating the variation due to such factors.

Hereinafter in the specification of this application, the single circuit for generating a clock signal is referred to as a clock generator, and a circuit system for generating a stable clock signal by combining clock generators is referred to as a clock generator circuit.

SUMMARY OF THE INVENTION

With the foregoing in mind, It is a purpose of this invention to form a clock generator by a digital circuit.

Further, it is another purpose of this invention to form a clock generator which consumes a small area, and has good stability and fast convergence.

Furthermore, it is yet another purpose of this invention to form a clock generator only by the logic elements used in the conventional digital circuits, in consideration of productivity and expandability.

By forming a clock generator by a digital circuit as described above, it is possible to avoid the problems with the clock generator of an analog circuit as to the provision for design modification and implementation.

Precision becomes critical when the clock generator is formed by a digital circuit. Therefore, it is a further purpose this invention to overcome this problem. That is, it is an object of the invention of this application to combine the clock generators by digital circuits, to thereby provide a clock generator circuit in which phase shifts are alternately adjusted while performing continuous generation. An objective is to achieve a precision comparable to the clock generator by an analog circuit by using the clock generators by digital circuits.

BRIEF DESCRIPTION OF THE DRAWINGS

Some of the purposes of the invention having been stated, others will appear as the description proceeds, when taken in connection with the accompanying drawings, in which.

DESCRIPTION OF THE PREFERRED EMBODIMENT(S)

Figure 1B:
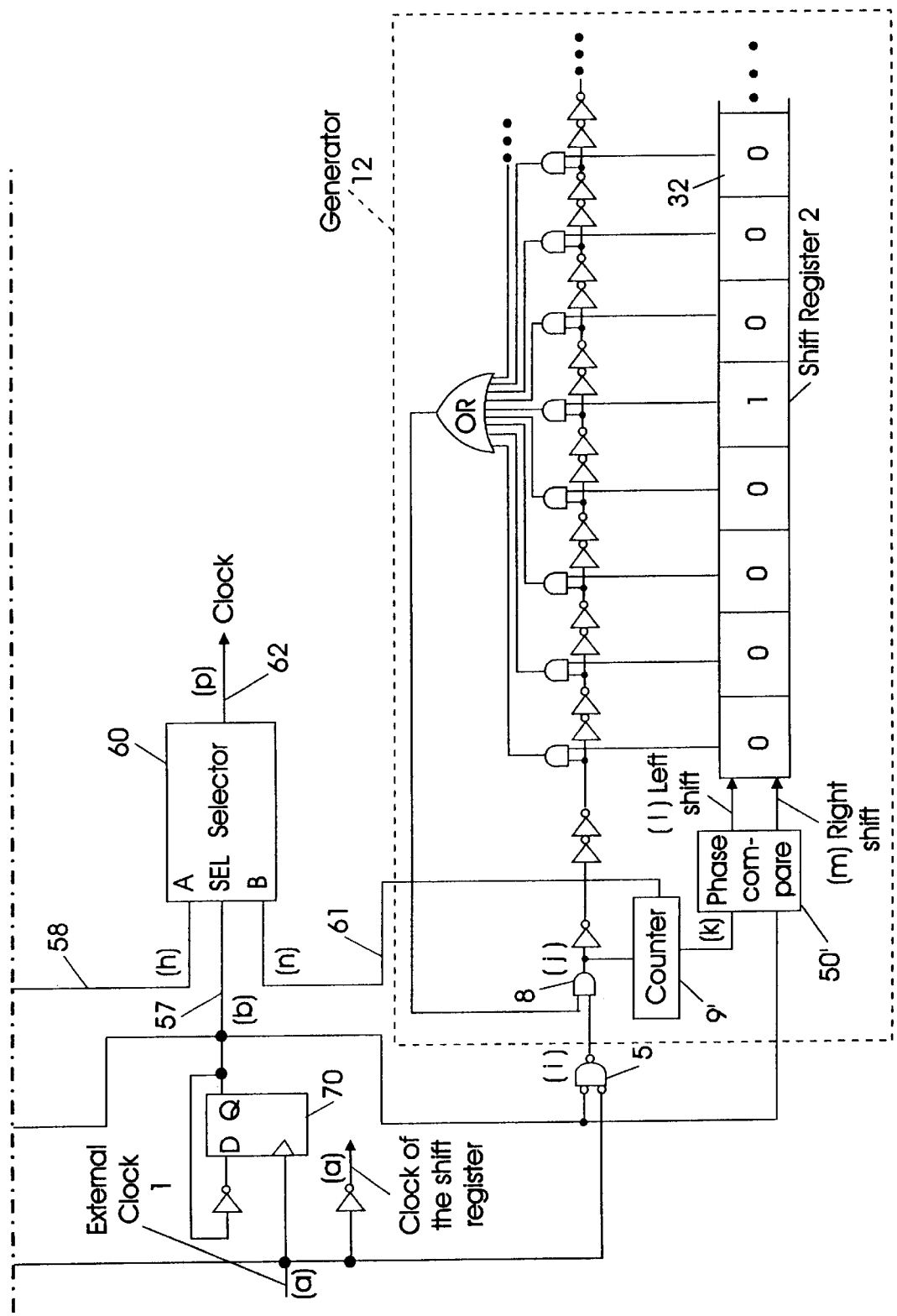
FIG. 1 is a diagram showing the construction of the clock generator circuit related to the invention of this application.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

The purposes of this invention can be accomplished by a clock generator comprising: an input logic circuit to which an external clock signal is supplied; a delaying element chain in which a plurality of delay elements connected to the input logic circuit are serially connected together; a plurality of delay element selecting means connected to each of the plurality of delay elements, respectively; a closed loop formation mechanism connected to the delay element connected to a specific delay element selecting means storing a value indicating a selected status, and connected to the input logic circuit, for forming a closed loop between the delay element chain and the input logic circuit; and external output means connected to the input logic circuit.

More specifically, the delay element chain is formed by serially connecting two-stage inverter trains as delay elements. And, to each inverter train, delay element selecting means such as a shift register for storing a bit indicating a selected status is connected as means for selecting a desired inverter train. The delay element chain is connected to an external clock through the input logic circuit. And, a connection is provided for forming a closed loop between the selected inverter train and the input logic circuit as necessary. Since the number of delay elements included in the closed loop depends on which of the serially connected inverter trains is selected, the generation frequency as a clock generator can be changed. Further, whether the generation frequency should be increased or decreased is determined by performing the phase comparison between the external clock and the output of the clock generator as necessary, and by providing this information to the delay element selecting means, a clock signal showing a good phase matching with the external clock can always be generated.

In addition, to adjust the phase shift while continuously generating the clock output, two or more such clock generators are connected to a selector. While the output by the first clock generator is outputted as the output of the clock generator, the phase of the output of the second clock generator is compared with the phase of the external clock waveform to perform a phase adjustment so that the output of the second clock generator matches with the phase of the external clock. Thus, if a plurality of such clock generators proposed in the invention of this application are connected, the phase adjustment is performed by changing at least one of the data stored in the delay element of selecting means by the use of the control signal supplied to the delay element selecting means from the phase compare means.

FIG. 1 shows a clock generator circuit in accordance with this invention. As shown in FIG. 1, the clock generator circuit consists of two clock generators 10 and 12. An external clock signal 1 is supplied to each clock generator via OR circuits 3 and 5, respectively. Since the constructions of the clock generator 10 and the clock generator 12 are the same, the clock generator 10 is described below in detail.

The clock generator 10 comprises an input logic circuit 7 connected to the external clock signal 1 via the OR circuit 3, a delay element chain 20 made up of a plurality of inverters 22 which are delay elements, delay element selecting means 30 connected to the delay element chain 20, and a connection 40 for forming a closed loop between the delay element chain 20 and the input logic circuit 7.

The delay element chain 20 takes, for instance, a construction in which inverter trains (each having two serially connected inverters) 24, 25, and 26 comprised of two inverters 22 (NOT circuits) are serially connected. The inverter trains act as a delay circuit. Accordingly, not only the construction shown in FIG. 1 but also means having a delay effect can achieve the operation of the invention of this application. Further, the delay element chain 20 is connected to the external clock 1 via the OR circuit 3 and the input logic circuit 7. Nine inverter trains are shown in FIG. 1, but this is a matter of design. That is, it is necessary and sufficient for the delay element chain 20 to take a form in which a plurality of elements having a delay effect are serially connected.

There are some reasons for using inverter trains as delay elements as shown in FIG. 1. First, the inverter has the smallest delay among general-purpose logic elements. This leads to an advantage that fine adjustment can be made. Further, both rise delay and fall delay are the same in one element made up of inverter trains, and the high and low portions of the outputted clock are alternately generated in the same time. This cannot be expected if other elements are used. Accordingly, although the function of the invention of this application can be achieved if elements having a delay effect are serially connected, it is optimum if such function is achieved by the inverter trains such as shown in FIG. 1. Examples of other delay elements include a buffer, AND, AND trains, OR, NOR trains, etc.

The delay element selecting means 30 selects a specific delay element to determine the generation frequency of a closed loop to be formed. The delay element selecting means 30 is preferably made up of bit storing mechanism 32 having a function of storing one bit, such as shift register. In FIG. 1, nine bit storing mechanisms 32, 34, 35, and 36 are shown. Each bit storing mechanism is connected to the corresponding delay element (inverter train). That is, the bit storing mechanism 34 is connected to the corresponding inverter train 24, and the bit storing mechanism 35 is connected to the corresponding inverter train 25. The other bit storing mechanisms are similarly connected to the corresponding inverter trains.

A data bit indicating a selected status is inputted to the specific bit storing mechanism 36 (hereinafter referred to as selecting bit storing mechanism) included in the delay element selecting means 30. Although the selected status is "1" in FIG. 1, it may be "0". The inputting of a bit indicating such a selected status to the selecting bit storing mechanism 36 causes the specific inverter train 26 (hereinafter referred to as selected inverter train) to be selected as the turning point of the closed loop, and as a result, the generation frequency of the closed loop is determined. That is, the more to the left the specific bit storing mechanism into which a data bit indicating a selected status is inputted exists in FIG. 1, the higher the generation frequency is; and the more to the right, the lower the generation frequency. The reason is that, the more to the right the selecting bit storing mechanism exists, the more inverter trains are included in the closed loop, the generated period is increased by the delay effect of the inverter trains, and the generation frequency decreases correspondingly. That is, in FIG. 1, since the selecting bit storing mechanism is the bit storing mechanism 36, the inverter train 26 is selected as a selected inverter train. Accordingly, the closed loop to be formed includes four inverter trains as delay elements. If the bit storing mechanism 35 is set as the selecting bit storing mechanism, the turning point of the closed loop is the inverter train 25, and thus two inverter trains as delay elements are included in the closed loop to be formed. Since the number of the inverter trains as delay elements included in the closed loop varies depending on which bit storing mechanism is selected as the selecting bit storing mechanism, as described above, the generation frequency as the clock generator also varies accordingly.

Thus, the function of the delay element selecting means 30 is to select from the delay element chain 20 a selected inverter train as the turning point in the formation of the closed loop. Accordingly, if such function can be achieved, it is not particularly limited to the shift register, and it is also unnecessary to have the bit storing function. However, as described later, it is desirable that the delay element selecting means 30 has a function to react to the shift signals 52 and 54 outputted from a phase compare circuit 50.

The delay element chain 20 and the delay element selecting means 30 are connected to the input logic circuit 7 by a closed loop formation mechanism 40 which is a connection, whereby a closed loop is formed. For instance, in FIG. 1, the bit storing mechanism 36 (hereinafter referred to as selecting bit storing mechanism) storing the data bit indicating a selected status is selected, and to an AND circuit 42, the output from the selecting bit storing mechanism 36 is inputted via a line 44, while the output from the selected inverter train 26 corresponding to the selecting bit storing mechanism 36 is inputted via a line 43. Accordingly, the output of the AND circuit 42 becomes active, and it is inputted via a line 45 to an OR circuit 46 which collects the outputs from the all AND circuits. Since the output of the OR circuit 46 is supplied to the input logic circuit 7 via a line 47, a closed loop is completed. Also for the closed loop formation mechanism 40, FIG. 1 is merely an example. It is sufficient if it has a function of connecting one or more delay elements determined by the relationship between the delay element chain 20 and the delay element selecting means 30 to the input logic circuit 7.

Since each bit storing mechanism and the corresponding inverter train are connected by an AND circuit as described above, a closed loop is formed, with the selecting bit storing mechanism 36 being as the turning point. Accordingly, if the position of the selecting bit storing mechanism shifts to the left, the number of the inverter trains as delay elements included in the closed loop decreases, resulting in an increase in the generation frequency of the closed loop, and conversely, if the position of the selecting bit storing mechanism shifts to the right, the number of the inverter trains as delay elements included in the closed loop increases, resulting in a decrease in the generation frequency of the closed loop. Thus, the number of the delay elements included in the closed loop can be controlled by putting an appropriate bit storing mechanism in a selected status, and as a result, the generation frequency can be freely set. And, the phase adjustment can be performed by the phase comparison with the external clock 1.

There is a possibility that the slight frequency difference between the externally supplied clock may cause a shift between the phase of the external clock and the phase of the output of the clock generator. Accordingly, to compensate this shift, it is needed to perform the phase adjustment at every fixed period. This phase adjustment is described below. A phase compare circuit 50 is provided in the clock generator 10. The output of the clock generator 10 and the external clock 1 are supplied to the phase compare circuit 50 via lines 56 and 59, respectively, and the phases of the two are compared. If the phase of the external clock 1 advances, the phase compare circuit 50 provides a left-shift signal 52 to the delay element selecting means 30 so as to increase the generation frequency of the clock generator 10 for phase matching. On the other hand, if the phase of the external clock 1 lags, the phase compare circuit 50 provides a right-shift signal 54 to the delay element selecting means 30 so as to decrease the generation frequency of the clock generator 10 for phase matching.

A description will now be given of a selector 60 for selecting the output of a clock generator to provide the output as the clock generator circuit. The output from the clock generator 10 is supplied to the selector 60 via a line 58. Similarly, the output from the clock generator 12 is supplied to the selector 60 via a line 61. The selector 60 is a mechanism for selecting and outputting either the output of the clock generator 10 or the output of the clock generator 12. As described later, the characteristic feature of the clock generator circuit related to the invention of this application is that, by alternately or sequentially outputting the outputs of a plurality of clock generators, the phase of the clock generator in a state of providing no output (idle state) is adjusted while one clock generator is in an output state. This enables the phase shift to be kept at minimum. Accordingly, the selector 60 as means for selecting the output of a clock generator is necessary. A line 62 is connected to the selector 60, and it outputs the output of either selected clock generator as the clock signal generated by the clock generator circuit related to the invention of this application.

Figure 2:
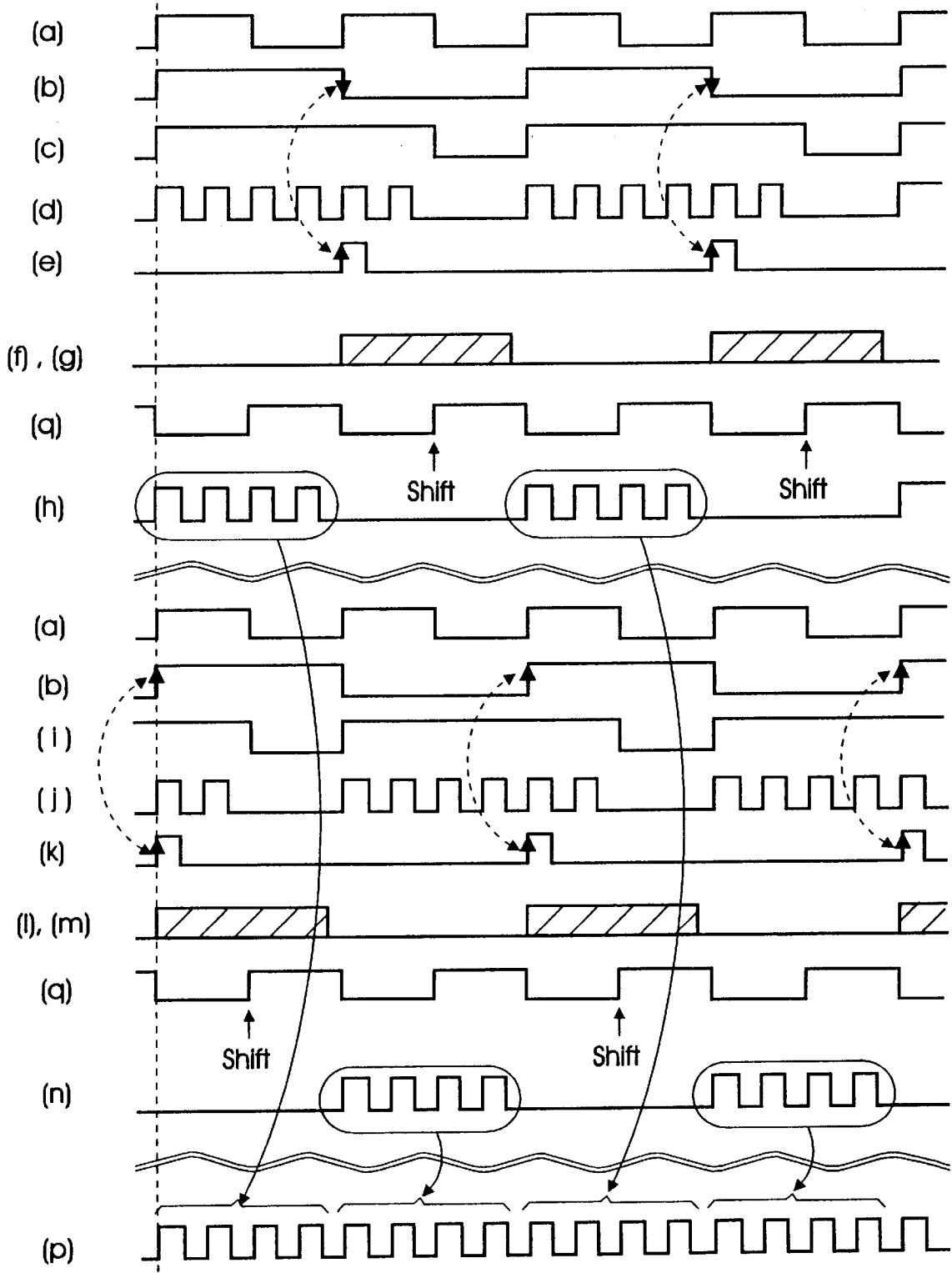
FIG. 2 is a timing chart showing the operation of the clock generator circuit related to the invention of this application.

A description will now be given of the operation of a circuit made by combining the clock generators of this invention. FIG. 2 shows the timing chart of this invention. This timing chart is for the case in which a clock four times the input clock (external clock) is generated by the clock generator circuit related to the invention of this application, by way of example. In addition, (a) to (p) in the chart are the waveforms at the respective portions in FIG. 1.

The waveform at (a) is the input clock (external clock). The input clock is divided by two using a divider 70 as shown in FIG. 1. The waveform (b) obtained by this and the waveform (a) of the input clock are inputted to the OR circuits 3 and 5 connected to the respective clock generators 10 and 12, obtaining waveforms (c) and (i). These waveforms (c) and (i) have a period two times the waveform (a) of the input clock. In FIG. 2, the waveforms (c) and (i) have a function as a reset signal for the respective clock generators 10 and 12. For instance, the waveform (c) is inputted to the input logic circuit 7, an AND circuit, along with the output 47 from the closed loop formation mechanism 40. Thus, since the closed loop is formed only in the period of time in which the waveform (c) is active, the clock generator 10 starts the generation at the rise of the waveform (c) and completes the generation at the fall of it. This is shown by a waveform (d).

The OR circuits 3 and 5 are not the same in the strict sense. As shown in FIG. 1, in the OR circuit 3, the waveform (b) is inputted after inverted, whereas to the OR circuit 5, the waveform (b) is inputted without being inverted. Since this difference exists, the waveforms (c) and (i) generated with the waveform (b) being as one input are activated or inactivated with different timings as shown in FIG. 2. And, the respective waveforms are connected to the input logic circuits 7 and 8, and, as described above, each clock generator 10 or 12 performs the generation only for the time during which each waveform (c) or (i) is active. Thus, the waveform (j) of the clock generator 12 is generated at times different from the waveform (d) of the clock generator 10 (in FIG. 2, they are partially overlapping in time). As a result, by selecting the partial waveform (n) of the waveform (j) and the partial waveform (h) of the waveform (d) by means of the counters 9 and 9' provided in the respective clock generators to remove the overlapping portions, and selecting and outputting them by means of the selector 60, a continuous output waveform (p) as the clock generator circuit is obtained. The selection by the selector 60 is also performed by the inputting of the waveform (b) to the selector 60. That is, the waveform of the clock generator 10 is selected and outputted when the waveform (b) is "high", and the waveform of the clock generator 12 is selected and outputted when the waveform (b) is "low".

In this embodiment, only four of the continuous six waveforms of the waveforms (d) and (j) are used as output. This is to prevent a glitch from occurring in the output waveform. The glitch means an unwanted pulse having a very narrow width. It can occur immediately before the fifth pulses of the waveforms (d) and (j) by the slight time differences in the fall and rise between the waveform (b) and the divided waveforms (d) and (j). Thus, the fifth waveforms are not used as output in this embodiment. In other words, in this embodiment, the first four pulses are used because the object is to generate four-times clock. In general, an N-times clock can be generated by using the first N pulses.

The foregoing is related to the mechanism for the clock generator circuit related to the invention of this application to output a continuous waveform. The mechanism for the clock generator circuit of the invention of this application to perform an alternate phase adjustment is shown below.

To take out waveforms for phase adjustment, the counters 9 and 9' are used to extract only fifth pulse waveforms. The waveforms taken out are shown as (e) and (k). Then, the phases of the waveforms (e) and (k) divided in this way are compared with the phase of the original waveform (b). The phase comparison is made by the phase compare circuits 50 and 50', and actually it is performed by comparing the falling edges or rising edges. That is, in the clock generator 10, the falling edge of the waveform (b) is compared with the rising edge of the waveform (e). On the other hand, in the clock generator 12, the rising edge of the waveform (b) is compared with the rising edge of the waveform (k). As a result of the phase comparison, the phase compare circuits 50 and 50' produce the shift signals 52 and 54 and supply them to the delay element selecting means 30. That is, the phase comparison indicates that, if the waveform (b) advances, the phase compare circuit 50 supplies the left-shift signal 52 to the delay element selecting means 30 so as to increase the generation frequency of the clock generator 10 for phase matching. On the other hand, if the phase of the waveform (e) advances, the phase compare circuit 50 supplies the right-shift signal 54 to the delay element selecting means 30 so as to decrease the generation frequency of the clock generator 10 for phase matching.

The phase adjustment of one clock generator is performed while the other clock generator performs the outputting. That is, the shift signal waveforms (f) and (g) related to the phase adjustment of the clock generator 10 are activated only in the period of time in which the clock generator 12 is providing the output (refer to waveform (n)). Further, the shift signal waveforms (l) and (m) related to the phase adjustment of the clock generator 12 are also activated only in the period of time in which the clock generator 10 is providing the output (refer to waveform (h)). Accordingly, in the clock generator circuit related to the invention of this application, while one clock generator is in the outputting state, the phase adjustment of the other clock generator in the idle state is performed. And, the other clock generator which has been in the idle state after the completion of the phase adjustment starts to produce the output. Thus, in accordance with the clock generator circuit related to the invention of this application, a plurality of clock generators having completed the phase adjustment always produces the output in sequence, so that it is possible to generate a pulse whose phase shift is very little.

In addition, since a waveform (q) obtained by inverting the waveform (a) is supplied to the delay element selecting means 30 as a clock signal, the shift operation of the delay element selecting means 30 is enabled with the timing shown by arrows in FIG. 2.

Further, the occurrence of a racing may cause the right-shift signal 54 and the left-shift signal 52 to be activated at the same time. The racing means that, when the data inputted to a plurality of flip-flops change nearly concurrently with the rise of the clock, a state which cannot logically occur is caused by the difference in the circuit delay. In this case, no shift operation is carried out, because it is suggested that there is no phase shift.

Although, in this embodiment, description has given of the case in which two clock generators are alternately caused to perform the generation, the gist of this invention can also be applied to the case in which three or more clock generators are sequentially used. In addition, the operation mode using such plurality of clock generators can be implemented not only by clock generators by digital circuits, but also by clock generators by analog circuits.

This invention is characterized in that a self-adjustable generator is constructed by a digital circuit. The self-adjusting can be made even if the delay of an element is made to change by a change in the temperature, voltage or the like. Accordingly, there is no large variation in the output waveform, and a very stable generation is enabled. In this respect, the conventional generator and clock generator circuit by analog circuits have been implemented by digital circuits, and thus the provision for a change in the specification and the implementability, the disadvantages of the analog circuit, have been overcome.

Further, in accordance with the clock generator circuit related to this invention, a style of employing a plurality of generators is used, so that each clock generator can quickly converge on the generation frequency. This is a very advantageous feature, because the clock is stopped and restarted very often under the recent trend to low power consumption. In addition, the maximum time taken for the convergence can be calculated from the number of the stages of the delay elements in the clock generator.

Moreover, since each clock generator is always reset once for every second cycles of the input clock, the phase shift due to the deviation of the generation frequency is not accumulated. By introducing this mechanism, a clock generator circuit by digital circuits having a precision comparable to that of the clock generator circuit by analog circuits can be achieved.

In the drawings and specifications there has been set forth a preferred embodiment of the invention and, although specific terms are used, the description thus given uses terminology in a generic and descriptive sense only and not for purposes of limitation.

What is claimed is:

1. A clock signal generator comprising:
   input logic connected to an external clock and receiving therefrom an external clock signal defining an input frequency;
   a delay chain connected to said input logic, said delay chain having a plurality of delaying circuits connected serially together in a chain;
   a plurality of delay selectors each connected to a corresponding one of said delaying circuits, said delay selectors settable to a first state in which said corresponding one delaying circuit is included in a closed loop and a second state in which a next following one of said delaying circuits is excluded from the closed loop;
   loop closing logic connected to said plurality of delay selectors and to said input logic, said loop closing logic forming a closed loop with said input logic and at least one of said delaying circuits which has its corresponding selector set to said second state; and
   output logic connected to said input logic and delivering a generated clock signal.

2. A clock signal generator according to claim 1 wherein said delaying circuit consists of at least two serially connected inverters.

3. A clock signal generator according to claim 1 further comprising a phase comparator connected to said input logic and said output logic and receiving as inputs said external clock signal and said generated clock signal, said phase comparator being connected to said selectors and delivering thereto a control signal.

4. A clock signal generator according to claim 3 wherein said phase comparator compares the phase of said external clock with the phase of the output of said output logic, and in response to the result, delivers a control signal to said selectors for changing the output frequency of said clock signal generator so that said phases match with each other.

5. A clock signal generating system comprising:

first clock generating logic generating a first clock signal;

second clock generating logic generating a second clock signal; and selector circuitry connected to said first and second clock generating logics and receiving as input the clock signals generated thereby, said selector circuitry delivering as output the output of a selected one of said first clock generating logic and said second clock generating logic;

said second clock generating logic comparing the phase of the output thereof with the phase of an external clock to adjust the phase of said second clock generating logic so that the phase of the output of said second clock generating logic matches with the phase of said external clock while said selector circuitry delivers as output the clock signal generated by said first clock generating logic.

6. A clock signal generating system of claim 5 wherein said first clock generating logic and said second clock generating logic each comprise:

input logic connected to an external clock and receiving therefrom an external clock signal defining an input frequency;

a delay chain connected to said input logic, said delay chain having a plurality of delaying circuits connected serially together in a chain;

a plurality of delay selectors each connected to a corresponding one of said delaying circuits, said delay selectors settable to a first state in which said corresponding one delaying circuit is included in a closed loop and a second state in which a next following one of said delaying circuits is excluded from the closed loop;

loop closing logic connected to said plurality of delay selectors and to said input logic, said loop closing logic forming a closed loop with said input logic and at least one of said delaying circuits which has its corresponding delay selector set to said second state; and output logic connected to said input logic and delivering a generated clock signal.

7. A clock signal generating system of claim 6 further comprising a phase comparator connected to said input logic and said output logic and receiving as inputs said external clock signal and said generated clock signal, said phase comparator being connected to said delay selectors and delivering thereto a control signal, and further wherein said phase adjustment is performed by changing the state of at least one of said delay selectors.

8. A clock signal generating system of claim 6 further comprising a phase comparator connected to said input logic and said output logic and receiving as inputs said external clock signal and said generated clock signal, said phase comparator being connected to said delay selectors and delivering thereto a control signal and further wherein said phase adjustment is performed by the control signal supplied from said phase comparator to said delay selectors.

9. A clock pulse generation method by a clock signal generating system comprising first clock generating logic and second clock generating logic both for generating a clock signal, and selector circuitry having inputted thereto the outputs of said first clock generating logic and said second clock generating logic for outputting the output of a selected one of either said first clock generating logic or said second clock generating logic, said clock pulse generation method comprising:

a first generation step in which said selector circuitry outputs the output of said first clock generating logic;

first phase adjusting step in which, simultaneously with said first generation step, the phase of the output of said second clock generating logic is compared with the phase of an external clock to adjust the phase of said second clock generating logic so that the phase of the output of said second clock generating logic matches with the phase of said external clock;

a second generation step in which said selector circuitry outputs the output of said second clock generating logic;

and a second phase adjustment step in which, simultaneously with said second generation step, the phase of the output of said first clock generating logic is compared with the phase of the external clock to adjust the phase of said first clock generating logic so that the phase of the output of said first clock generating logic matches with the phase of said external clock.

10. A clock pulse generation method of claim 9 wherein said first generation step and said second generation step are unintermittently repeated.

* * * * *